(12) United States Patent
Gorobets et al.

(10) Patent No.: US 11,133,067 B2
(45) Date of Patent: Sep. 28, 2021

(54) MULTI-PHASED PROGRAMMING WITH BALANCED GRAY CODING

(71) Applicant: Western Digital Technologies, Inc., San Jose, CA (US)

(72) Inventors: Sergey Anatolievich Gorobets, Edinburgh (GB); Xinmiao Zhang, Mercer Island, WA (US); James Fitzpatrick, Laguna Niguel, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 94 days.

(21) Appl. No.: 16/297,359

(22) Filed: Mar. 8, 2019

(65) Prior Publication Data

US 2020/0286562 A1    Sep. 10, 2020

(51) Int. Cl.
*G11C 16/10* (2006.01)
*G06F 11/10* (2006.01)
*G11C 16/26* (2006.01)

(52) U.S. Cl.
CPC .......... *G11C 16/10* (2013.01); *G06F 11/1068* (2013.01); *G06F 11/1072* (2013.01); *G11C 16/26* (2013.01)

(58) Field of Classification Search
None
See application file for complete search history.

(56) References Cited

U.S. PATENT DOCUMENTS

| | | | |
|---|---|---|---|
| 8,027,195 B2 | 9/2011 | Li et al. | |
| 9,123,422 B2 | 9/2015 | Yu et al. | |
| 9,697,892 B1 | 7/2017 | Varanasi et al. | |
| 9,715,939 B2 | 7/2017 | Ellis et al. | |
| 9,830,983 B1 | 11/2017 | Hara et al. | |
| 9,928,126 B1 | 3/2018 | Shappir et al. | |
| 2006/0209592 A1 | 9/2006 | Li et al. | |
| 2008/0285652 A1 | 11/2008 | Cho | |
| 2009/0097313 A1 | 4/2009 | Park | |
| 2011/0038207 A1 | 2/2011 | Eun | |

(Continued)

OTHER PUBLICATIONS

S. Liu et al., "QLC NAND study and enhanced Gray coding methods for sixteen-level-based program algorithms," Microelectronics Journal, May 31, 2017, pp. 58-66, vol. 66, Elsevier Ltd.

*Primary Examiner* — Charles Rones
*Assistant Examiner* — Jonah C Krieger
(74) *Attorney, Agent, or Firm* — Morgan, Lewis & Bockius LLP (57) ABSTRACT

Disclosed are systems and methods for providing multi-phased programming with balanced Gray coding. A method includes programming, in a first phase, a first portion of data into memory cells of a flash memory in a first-level cell mode. The method also includes retaining, in a cache, at least a subset of the data. The method also includes regenerating the data from at least the cache, wherein the regenerated data includes a second portion of the data. The method also includes programming, in a second phase, the regenerated data in a second-level cell mode based on a mapping from the first-level cell mode to the second-level cell mode. The mapping maps each state distribution in the first-level cell mode to at least two non-adjacent state distributions in the second-level cell mode, and a width of each state distribution in the first-level cell mode may be narrowed.

18 Claims, 9 Drawing Sheets

(56) References Cited

U.S. PATENT DOCUMENTS

| | | |
|---|---|---|
| 2014/0059406 A1 | 2/2014 | Hyun et al. |
| 2014/0108705 A1* | 4/2014 | Gorobets ............ G11C 16/3431 |
| | | 711/103 |
| 2015/0043276 A1* | 2/2015 | Sharon ................ G06F 11/1068 |
| | | 365/185.03 |
| 2015/0193302 A1 | 7/2015 | Hyun et al. |
| 2016/0085456 A1* | 3/2016 | Yamada .................. G06F 12/00 |
| | | 711/103 |
| 2016/0125951 A1 | 5/2016 | Sun et al. |
| 2018/0293014 A1* | 10/2018 | Ravimohan ............ G11C 16/10 |
| 2018/0366189 A1* | 12/2018 | Bedeschi ............. G11C 14/009 |
| 2019/0304546 A1 | 10/2019 | Hsiao |

* cited by examiner

| | S0 | S1 | S2 | S3 | S4 | S5 | S6 | S7 | S8 | S9 | S10 | S11 | S12 | S13 | S14 | S15 | | Read levels |
|---|---|---|---|---|---|---|---|---|---|---|---|---|---|---|---|---|---|---|
| Top | 1 | 1 | 1 | 1 | 1 | 0 | 0 | 0 | 0 | 0 | 1 | 1 | 0 | 0 | 0 | 1 | 4 | S5,S10,S12,S15 |
| Upper | 1 | 1 | 0 | 0 | 0 | 0 | 0 | 0 | 1 | 1 | 1 | 1 | 1 | 0 | 0 | 0 | 3 | S2,S8,S14 |
| Middle | 1 | 1 | 1 | 0 | 0 | 0 | 0 | 1 | 1 | 0 | 0 | 0 | 0 | 1 | 1 | 1 | 4 | S3,S7,S9,S13 |
| Lower | 1 | 0 | 0 | 0 | 1 | 1 | 0 | 0 | 0 | 0 | 0 | 1 | 1 | 1 | 1 | 1 | 4 | S1,S4,S6,S11 |

MULTI-PHASED PROGRAMMING WITH BALANCED GRAY CODING

BACKGROUND

The growing demand for high capacity storage devices has catalyzed the use of multi-level not and (NAND) flash memory cells, which include multi-level cells (MLC, 2 bits per cell), triple level cells (TLC, 3 bits per cell), quad level cells (QLC, 4 bits per cell), and higher capacities. As the number of bits stored in a memory cell increases, the level of precision required for reliable data programming also becomes stricter in tandem. Existing approaches for precise programming of multi-level cells may demand additional hardware resources, which increases the complexity and cost of the storage device while reducing available space for other productive uses. Thus, there is a need for a more efficient method of programming multi-level cells.

The description provided in the background section should not be assumed to be prior art merely because it is mentioned in or associated with the background section. The background section may include information that describes one or more aspects of the subject technology, and the description in this section does not limit the invention.

BRIEF DESCRIPTION OF THE DRAWINGS

A detailed description will be made with reference to the accompanying drawings.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology may be practiced without these specific details. In some instances, structures and components are shown in block diagram form in order to avoid obscuring the concepts of the subject technology. Like components are labeled with identical element numbers for ease of understanding.

The present description relates in general to data storage systems and methods, and more particularly to, for example, without limitation, providing multi-phased programming using a balanced Gray code. Due to hardware and physical limitations among other factors, memory cells are often programmed into a limited voltage range, such as approximately 6.2 V. For multi-level cells with a large number of bits per cell, a corresponding large number of distributions needs to be programmed. For example, when including the erased state, QLC memory cells are programmed into 16 distributions corresponding to $2^4$ possible states for storing 4 bits of data within a limited voltage range, such as 6.2 V. It may not be feasible to precisely program these distributions in a single programming pass.

One approach to provide the required programming precision for multi-level cells is to use a foggy-fine programming approach. For example, when programming QLC memory cells, a first foggy phase may coarsely program 4 bits of data for each memory cell into wide overlapping distributions that are below target voltages, whereas a second fine phase may precisely program the same 4 bits of data for each memory cell to extend into narrower distributions containing the target voltages.

Figure 1A:
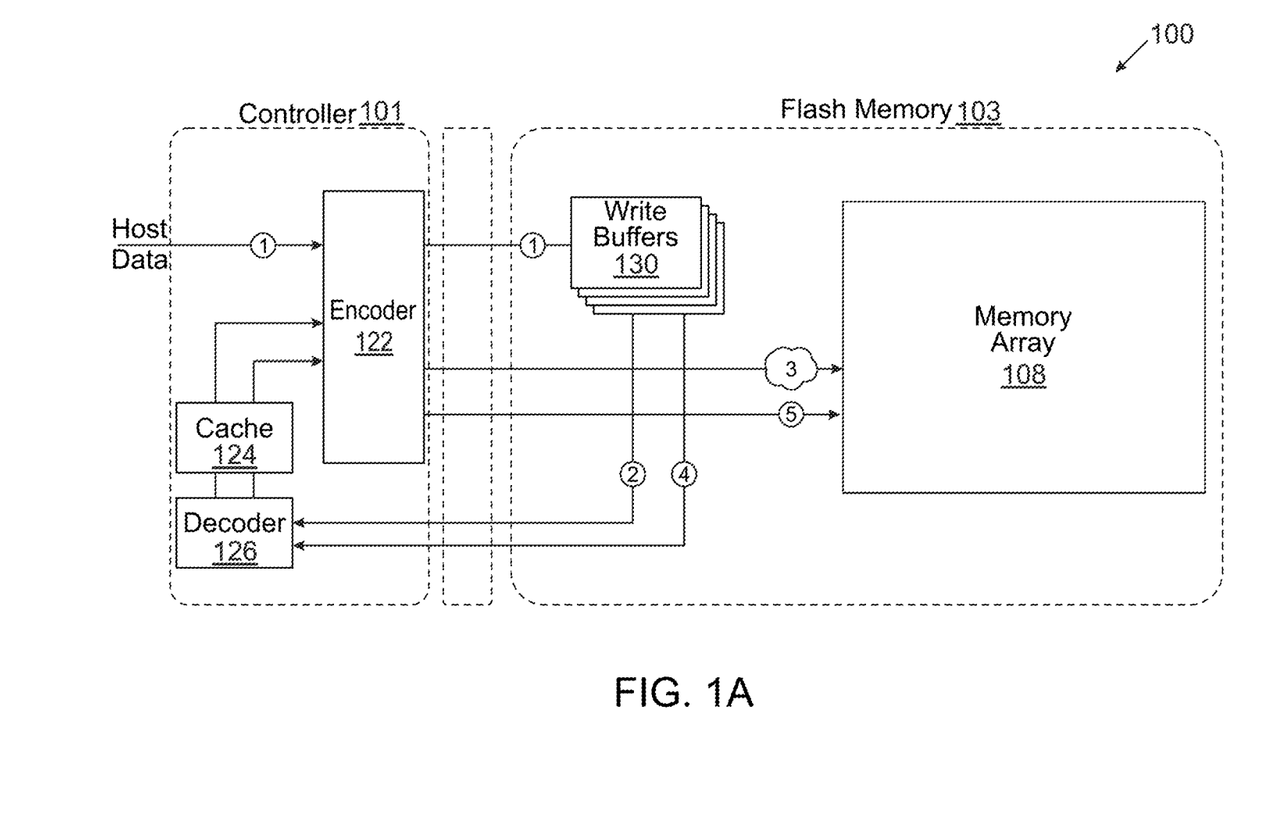
FIG. 1A illustrates an example system for programming QLC memory cells in a foggy-fine mode.

FIG. 1A illustrates an example system 100 for programming QLC memory cells in a foggy-fine mode. System 100 includes controller 101 and flash memory 103. Controller 101 includes encoder 122, cache 124, and decoder 126. Flash memory 103 includes memory array 108 and write buffers 130. With respect to FIG. 1A and FIG. 5, like numbered elements may correspond to like components. For example, controller 101 may correspond to controller 501, flash memory 103 may correspond to flash memory 503, and memory array 108 may correspond to NAND array 508. For simplicity, elements of FIG. 5 that are omitted from system 100 of FIG. 1A may actually be present, such as storage medium 502, host 504, interface 505, registers 506, and controller 507. Further, while FIG. 1A is illustrated with memory array 108 as QLC memory cells, it should be understood that the described techniques are general principles may also be applicable to memory cells of various levels.

In step 1, controller 101 may receive host data for a write operation, which is processed through encoder 122. For example, decoder 126 and encoder 122 may utilize low-density parity-check codes (LDPC) to provide error correction support. The encoded host data is then written into write buffers 130, which may be configured as a first in, first out (FIFO) queue. Write buffers 130 may preferably be SLC memory cells for high write endurance, but higher level memory cells may also be utilized. Using non-volatile memory, e.g. SLC flash memory for write buffers 130 can provide resilience against power failures to maintain data integrity, and may also be more cost effective and power efficient compared to volatile random access memory. While flash memory is provided as one example of non-volatile memory, other non-flash based technologies may also be used, which may include developing and emerging technologies. In other aspects of the subject technology, write buffers 130 may use volatile memory including data latches, registers, RAM, or other hardware.

Note that write buffers 130 are shown in a stack with 4 blocks. The number of blocks may correspond to the number of memory pages, or the number of bits per memory cell in memory array 108. For example, when memory array 108 corresponds to QLC memory cells, or 4 bits per memory cell, then write buffers 130 may include 4 blocks, or one flash memory block for each memory page to be programmed.

In step 2, controller 101 reads back the write buffers 130 and applies error correction algorithms using decoder 126 to correct any errors while reading write buffers 130. Cache 124 may correspond to dynamic random access memory (DRAM) or static random access memory (SRAM) and may hold an intermediate data result between decoder 126 and encoder 122. A cache 124 may include a buffer, such as a page buffer. A cache 124 may be a non-volatile memory. Controller 101 further encodes the decoded data from cache 124 to prepare the data for programming.

Note that while write buffers 130 are shown as part of flash memory 103, which is directly accessible to controller 101, it should be understood that write buffers 130 may also be accessible from other locations. For example, referring to FIG. 5, write buffers 130 may be stored externally from controller 501, such as in storage medium 502. Thus, storage medium 502 may include write buffers 130, which may include flash or non-flash based non-volatile memory, SRAM, DRAM, magnetic RAM (MRAM), or phase change memory (PCM). Data transfers between controller 501 and storage medium 502 may be serialized over a data bus or use another transport method.

Figure 1B:
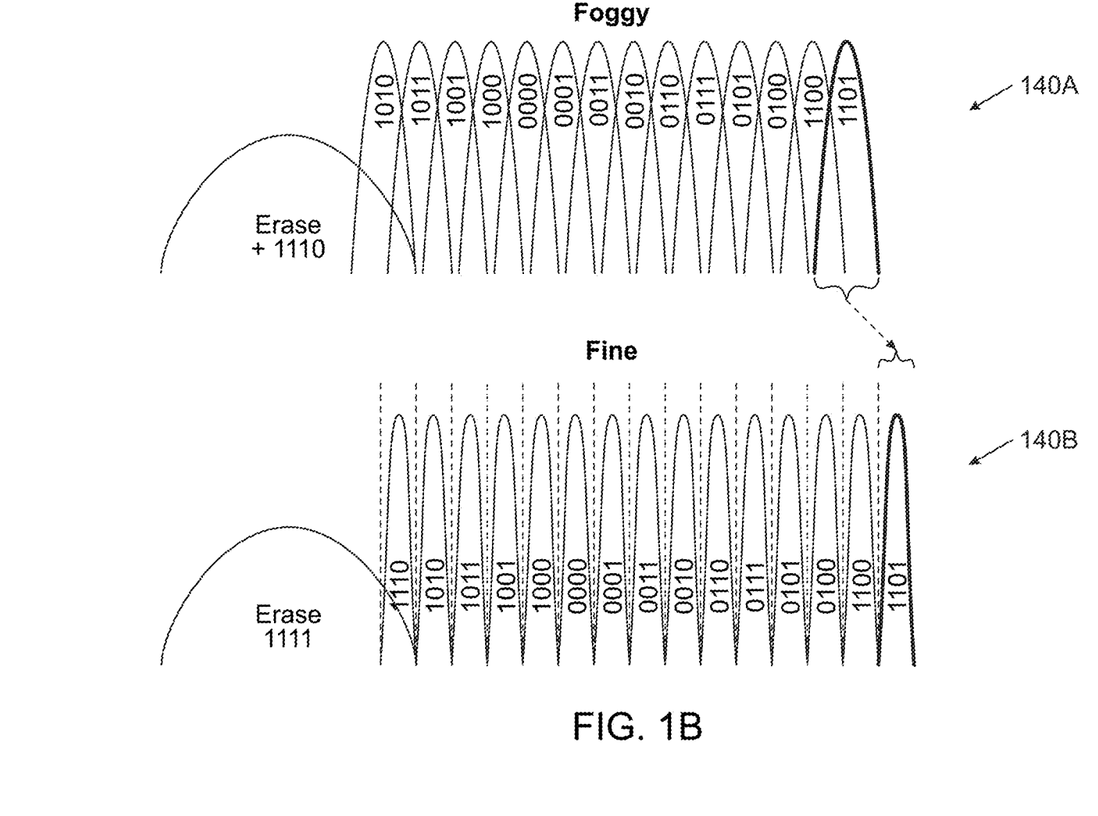
FIG. 1B illustrates example program distributions for QLC memory cells after programming in a foggy phase and a fine phase.

In step 3, controller 101 programs the decoded and encoded data into memory array 108 in a first foggy phase. Referring to FIG. 1B, an example program distribution 140A is shown for QLC memory cells, which may correspond memory array 108 after programming in the first foggy phase. As shown in FIG. 1B, the states in distribution 140A are programmed relatively wide, or with less precision, to enable the foggy phase to complete programming in a relatively shorter time compared to the fine phase. However, as a result, the data programmed into memory array 108 cannot be read back, as states in distribution 140A may overlap too far into other states to be distinguishable using error correction. Further, read disturb effects and other factors may also hinder reading the programmed data from memory array 108. Thus, write buffers 130 are instead used to store the data for the write operation.

In step 4, the data for the write operation in write buffers 130 is again read and processed through decoder 126, cache 124, and encoder 122 in preparation for programming the second fine phase. Accordingly, step 4 may proceed in a manner similar to step 2, as described above.

In step 5, controller 101 programs the decoded and encoded data into memory array 108 in a second fine phase. Referring to FIG. 1B, an example program distribution 140B is shown for QLC memory cells, which may correspond memory array 108 after programming in the second fine phase. As shown in FIG. 1B, the states in distribution 140B are programmed to their final target voltages with greater precision, which completes in a relatively longer time compared to the foggy phase. The second fine phase may program from the foggy phase to the fine phase according to mapping 150 of FIG. 1C, which may correspond to a Gray code. A Gray code is an encoding wherein adjacent codes differ by only one bit, which enables more efficient error correction. For example, in mapping 150, the code for state S0 is "1111", whereas the code for the right adjacent code S1 is "1110" and the left adjacent code S15 is "1011". Codes S1 and S15 each differ from code S0 by exactly one bit, or the fourth and second bits, respectively.

Figure 1C:
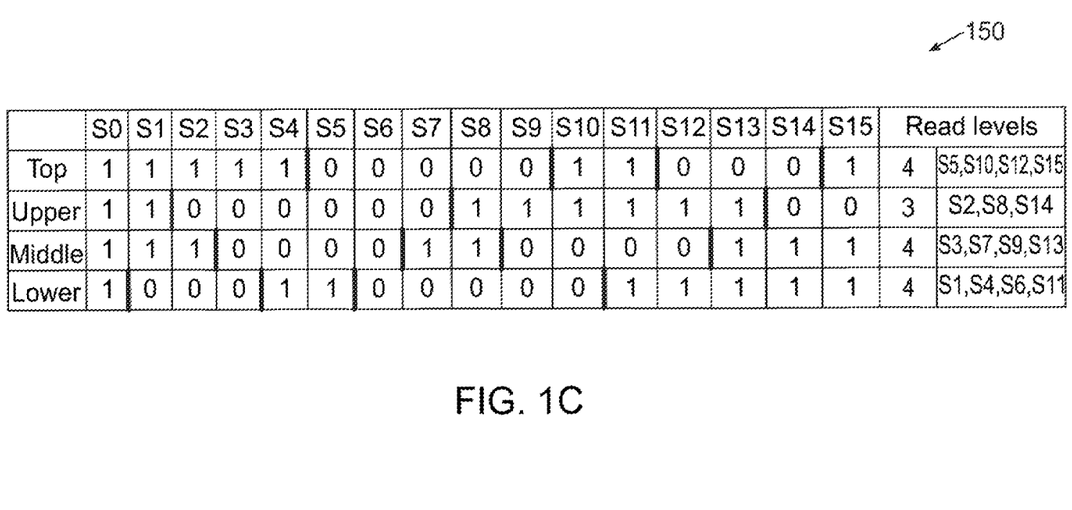
FIG. 1C illustrates an example balanced Gray coding for programming QLC memory cells in foggy-fine mode.

Further, mapping 150 may be a balanced Gray code, which enables faster read operations. In mapping 150, the top page (TP) has a transition count of 4, the upper page (UP) has a transition count of 3, the middle page (MP) has a transition count of 4, and the lower page (LP) has a transition count of 4. In one or more examples, a balanced Gray code may be satisfied when a difference between transition counts of any two pages of the memory pages does not exceed a predetermined transition count difference. The predetermined transition count difference may be one (1).

When examining the 4-3-4-4 Gray code of mapping 150, a difference can be calculated between the transition counts of any two pages selected from TP, UP, MP and LP. This may include calculating the difference for each of the following memory page pairs: (1) TP and UP, (2) TP and MP, (3) TP and LP, (4) UP and MP, (5) UP and LP, and (6) MP and LP. When a Gray code is configured such that each of these differences does not exceed the predetermined transition count difference, e.g. 1, then the Gray code is a balanced Gray code.

For example, the difference between the transition counts of TP and UP is 1. The difference between the transition counts of TP and MP is 0. The difference between the transition counts of TP and LP is 0. The difference between the transition counts of UP and MP is 1. The difference between the transition counts of UP and LP is 1. The difference between the transition counts of MP and LP is 0. Thus, for all the memory page pairings of the memory pages, the difference between the transition counts does not exceed 1, and the 4-3-4-4 Gray code is therefore balanced.

In one or more examples, a balanced Gray code may also be satisfied when a difference between transition counts between every two adjacent pages of the memory pages does not exceed a predetermined transition count difference. The predetermined transition count difference may be one (1). For example, when examining the 4-3-4-4 Gray code of mapping 150, a difference can be calculated between the transition counts of every two adjacent pages, such as (1) top page (TP) and upper page (UP), (2) upper page (UP) and middle page (MP), (3) middle page (MP) and lower page (LP), and (4) lower page (LP) and top page (TP). In this example, LP and TP are a wraparound pair and thus, they are considered to be two adjacent pages. When a Gray code is configured such that each of these differences does not exceed the predetermined transition count difference, e.g. 1, then the Gray code is a balanced Gray code.

For example, the difference between the transition counts of TP and UP is 1. The difference between the transition counts of UP and MP is 0. The difference between the transition counts of MP and LP is 0. The difference between the transition counts of LP and TP is 1. Thus, for every two adjacent pairings of the memory pages, the difference between transition counts does not exceed 1, and the 4-3-4-4 Gray code is therefore balanced. Thus, the 4-3-4-4 Gray code of mapping 150 is a balanced Gray code.

A balanced Gray code enables faster read operations since the maximum number of transitions to distinguish for each memory page is minimized. For example, when using a 4-3-4-4 balanced Gray code, a read operation distinguishes up to four (4) transitions for each memory page. Accordingly, the read operation does not bottleneck on any particular memory page having a significantly higher number of transitions relative to the other memory pages.

One drawback of the approach illustrated in system 100 of FIG. 1A is the additional cost, complexity, and performance penalty associated with write buffers 130. Since the I/O workload for write buffers 130 includes significant write activity, flash memory with high endurance, such as SLC flash memory, is preferable for write buffers 130. However, since SLC provides lower storage density and is thus more expensive to fabricate compared to the same capacity using multi-level memory cells, using SLC increases overall cost and reduces available physical space in flash memory 103 for other productive uses. For example, if write buffers 130 are omitted, memory array 108 may be expanded to accommodate more user data and/or overprovisioning. Accordingly, the capacity, endurance, performance, and cost effectiveness of a storage device using the foggy-fine programming approach of system 100 may be limited.

Figure 1D:
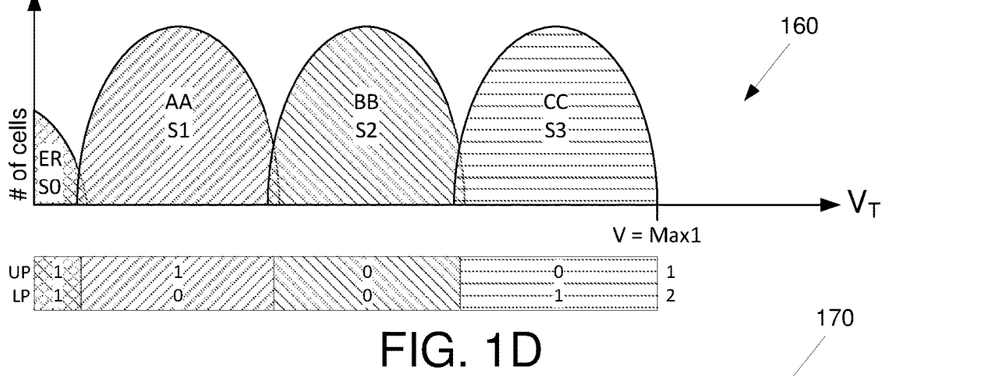
FIGS. 1D and 1E illustrate examples of program distributions after a first programming phase in MLC mode and a second programming phase in QLC mode using the unbalanced 2-level Gray nesting of FIG. 1F.
Figure 1E:
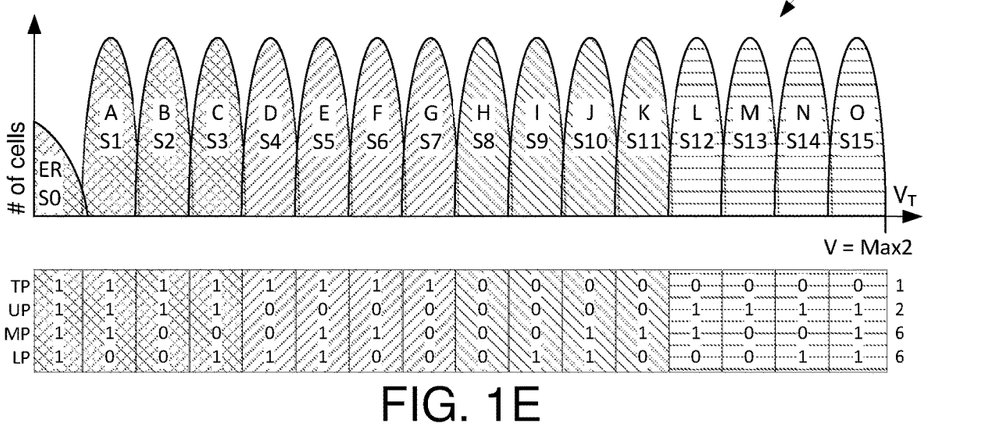
Figure 1F:
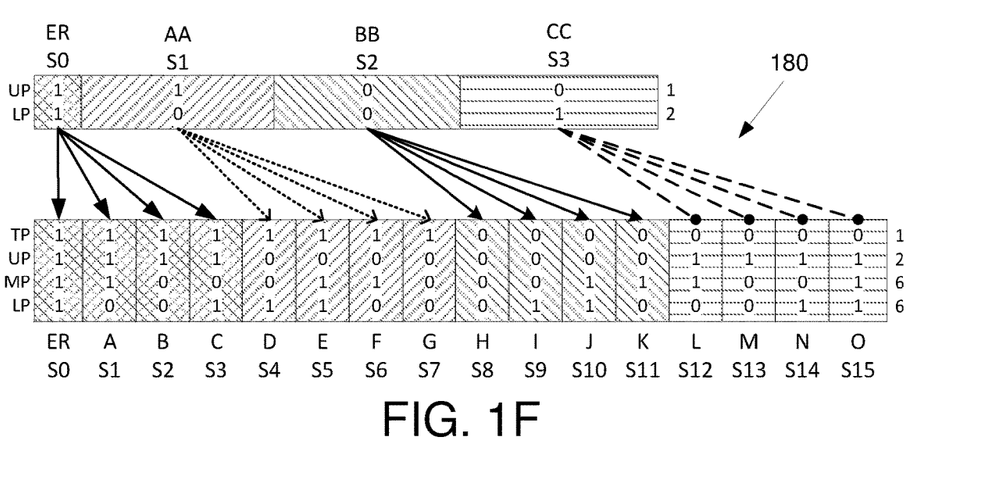
FIG. 1F illustrates an example unbalanced 2-level Gray nesting for multi-phased programming.

Instead of using a foggy-fine programming approach, a multi-phase programming approach may be used, as shown in FIG. 1D, FIG. 1E, and FIG. 1F. Referring to FIG. 1D, an example program distribution 160 is shown, which may correspond to a voltage distribution of memory array 108 after programming in a MLC mode within a first phase. As shown in distribution 160, four distributions corresponding to the erased state (ER, mapped to "11"), first state (AA, mapped to "10"), second state (BB, mapped to "00"), and third state (CC, mapped to "01") are programmed into a voltage range from 0 to Max1 volts. As shown in distribution 160, the MLC mode uses a 1-2 Gray code, wherein the upper page (UP) has one transition (between the AA and BB states) and the lower page (LP) has two transitions (first between the ER and AA states, and second between the BB and CC states). Unlike distribution 140A after programming in a foggy phase, distribution 160 after programming in a MLC mode is still readable, and thus the data programmed in distribution 160 does not necessarily need to be stored in write buffers to complete the remaining programming phases.

As shown in FIG. 1D, the states in distribution 160 are programmed relatively wide, with each MLC state width in program distribution 160 being approximately the combined width of the mapped QLC states after programming in a QLC mode within a second phase, as illustrated by program distribution 170 in FIG. 1E. For example, the MLC AA (S1) state maps to the D (S4), E (S5), F (S6), and G (S7) QLC states according to mapping 180 in FIG. 1F. Thus, the MLC state width of the MLC AA (S1) is approximately the combined width of four QLC states. Wider state widths may be preferred for higher reliability (e.g. greater safety margin between states) and/or faster programming time.

However, when the MLC state widths in distribution 160 are relatively wide and already occupy a large portion of the final voltage range V=Max2, possible permutations of mapping 180 in FIG. 1F may be correspondingly restricted. For example, feasible mappings may be limited to simple mappings of MLC states to consecutive QLC states. In this case, it may be difficult to maintain a balanced Gray code for the second phase in the QLC mode. Thus, a 1-2-6-6 unbalanced Gray code is used in distribution 170 and mapping 180. However, an unbalanced Gray code undesirably results in longer read times and higher error rates due to certain memory pages having larger transition counts, such as the middle page (MP) and lower page (LP) with six (6) transitions in mapping 180.

One or more implementations of methods and systems are provided for multi-phased programming with balanced Gray coding. In this approach, each programming phase may program and extend states to maintain a balanced Gray code in each phase. This may also be referred to as N-level Gray nesting, wherein N is the number of programming phases.

By using a mapping that maps each program state in a first phase to at least two non-adjacent program states in a subsequent second phase, a spread of code values can be provided to facilitate a selection of a balanced Gray code for each programming phase. Further, to provide sufficient voltage range for expansion, the state widths in a first phase may be less than the combined width of the corresponding mapped states in a subsequent second phase. Since the programmed data in each phase may be readable, write buffers may be correspondingly reduced or eliminated to improve the efficiency, cost, and performance of a storage device using the described multi-phased programming with balanced Gray coding.

In an example for programming QLC memory cells, a first phase programs the memory cells in a MLC mode using a balanced Gray coding. The target programming distributions in the first phase may be configured such that the state widths in the first phase are approximately half of the combined width of the corresponding mapped states in the second phase, or approximately 2 QLC states wide (i.e., half of 4 mapped QLC states). Alternatively, the state widths may be approximately 50% to 75% of the corresponding mapped states, or approximately 2-3 QLC states wide. As the memory cells are readable after the first phase, the second phase can read the programmed data directly from the memory cells in preparation for programming the memory cells in a QLC mode. Depending on the availability of cached program data, some or all of the write buffers may be omitted, which helps to simplify storage device design and frees device space for other productive uses such as storing user data or overprovisioning.

One or more implementations of the subject technology provide several performance benefits that improve the functionality of a computer. As discussed above, a foggy-fine programming approach requires write buffers to be reserved on the device, which in turn reduces space available for other productive purposes. Since the described multiphase programming procedure can read back the data directly from the programmed memory cells, the write buffer can be partially or completely omitted, thereby reclaiming device space for user data, overprovisioning, or other purposes. High endurance non-volatile memory suitable for the write buffers, such as SLC memory cells, can be expensive, and thus the partial or complete omission of the write buffers may help to improve the cost effectiveness of the storage device. Additionally, by using the reclaimed device space for user data, overprovisioning, or other purposes, various performance metrics of the storage device can be improved, such as write endurance, read/write bandwidth, read/write latency, and/or storage capacity. In turn, a host computer coupled to the storage device also receives the benefits of the storage device's improved performance.

Figure 2A:
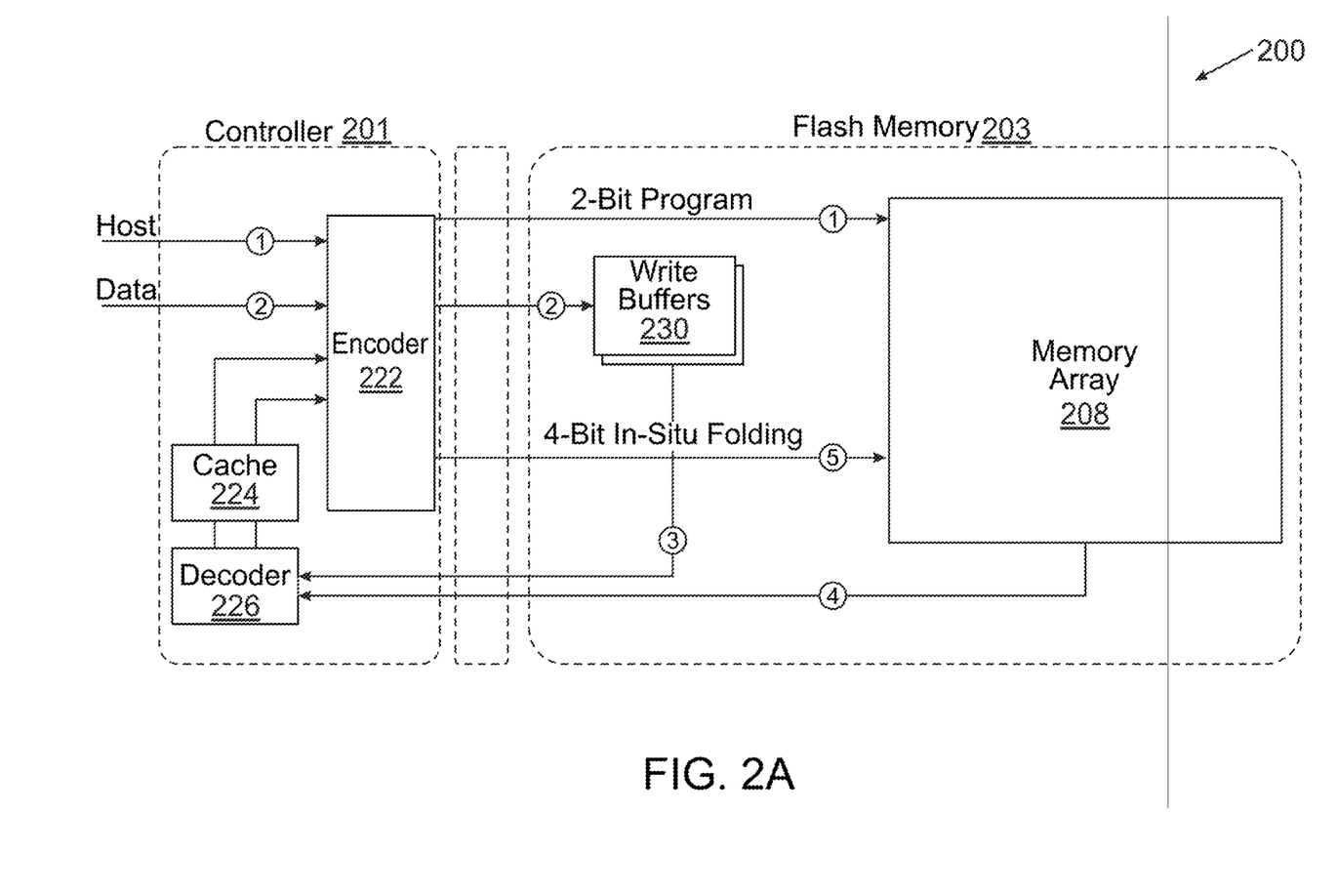
FIG. 2A illustrates an example system for multi-phased programming of QLC memory cells.

FIG. 2A illustrates an example system 200 for multi-phased programming of QLC memory cells. System 200 includes controller 201 and flash memory 203. Controller 201 includes encoder 222, cache 224, and decoder 226. Flash memory 203 includes memory array 208 and write buffers 230. With respect to FIG. 1A, FIG. 2A and FIG. 5, like numbered elements may correspond to like components. For example, controller 201 may correspond to controller 101, flash memory 203 may correspond to flash memory 103, memory array 208 may correspond to memory array 108, encoder 222 may correspond to encoder 122, cache 224 may correspond to cache 124, decoder 226 may correspond to decoder 126, and write buffers 230 may correspond to write buffers 130.

Further, while the examples illustrated in FIG. 2A and FIGS. 3A, 3B and 3C demonstrate a 2-level nested Gray code from MLC to QLC, it should be understood that the described techniques are generally applicable to multiphase programming of multi-level memory cells with various numbers of bits per cell. Thus, one or more aspects of the present technology may utilize memory cells with any number of states. For example, a 2-level nested Gray code from SLC to QLC or other variations are possible.

In step 1, controller 201 may receive a first portion of host data for a write operation. The first portion may be processed through encoder 222. The first portion may correspond to 2 bits of each 4-bit nibble in the host data, and may be arbitrarily selected, e.g. from the 2 most significant bits or the 2 least significant bits. The encoded first portion may then be programmed into memory array 208 in a first phase corresponding to an MLC mode or 2-bit program mode.

Figure 3A:
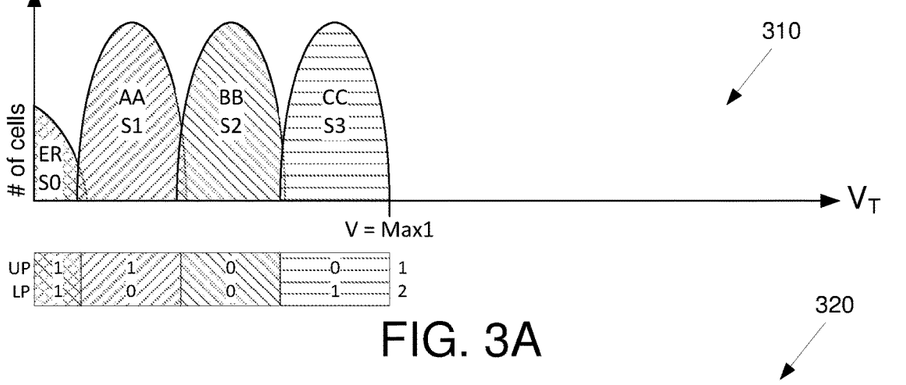
FIGS. 3A and 3B illustrate examples of program distributions after a first programming phase in MLC mode and a second programming phase in QLC mode using the 2-level Gray nesting of FIG. 3C.

Referring to FIG. 3A, an example program distribution 310 is shown, which may correspond to a voltage distribution of memory array 108 after programming the first phase in step 1. As shown in distribution 310, four distributions corresponding to the erased state (ER, mapped to "11"), first state (AA, mapped to "10"), second state (BB, mapped to "00"), and third state (CC, mapped to "01") are programmed into a voltage range from 0 to Max1 volts. As shown in distribution 310, the MLC mode uses a 1-2 Gray code, wherein the upper page (UP) has one transition (between the AA and BB states) and the lower page (LP) has two transitions (first between the ER and AA states, and second between the BB and CC states).

Programming of the first phase may use any suitable MLC programming technique. For example, programming and verify pulses may be alternated until the last verify pulse indicates that all of the programmed memory cells meet or exceed the program verify voltage for the desired program state. Note that the programming of the first phase in an MLC mode allows the programmed data to be read back normally, unlike the foggy phase of the foggy-fine programming approach. For example, it can be observed in distribution 310 that adjacent states have minor amounts of overlap that can be corrected using error correction algorithms provided by encoder 222 and decoder 226.

As shown in FIG. 3A, the states in distribution 310 are programmed relatively narrow compared to e.g. the states in distribution 160 of FIG. 1D, with each MLC state width in distribution 310 being less than the combined width of the mapped QLC states in program distribution 320. For example, the MLC AA (S1) state maps to the C (S3), D (S4), J (S10), and K (S11) QLC states according to mapping 330 in FIG. 3C. The MLC state width of the MLC AA (S1) is less than the combined width of the four QLC states, and may be approximately two QLC states wide. Of course, other mappings with wider or narrower MLC state widths are also possible.

In step 2, controller 201 may receive a second portion of the host data for the write operation. The second portion may be processed through encoder 222. The second portion may correspond to the remaining 2 bits of the 4-bit nibbles in the host data, and may thus comprise the bits that were not selected for the first portion of each 4-bit nibble in the host data. The encoded second portion may then be programmed into write buffers 230.

Note that write buffers 230 are shown in a stack with 2 blocks. Since the first portion may already be programmed into memory array 208 in step 1, the first portion may be retrieved by reading back from memory array 208, as discussed above. Accordingly, the buffers for the memory pages corresponding to the first portion may be omitted from write buffers 230, thereby halving the SLC memory block requirements for write buffers 230 in comparison to a foggy-fine programming approach. If a 2-level nested Gray code from SLC to QLC was utilized instead, then the SLC memory block requirements for write buffers 230 would be reduced by 25%, e.g. 3 blocks instead of 4 blocks. As a result, system 200 may dedicate more die space to memory array 208 to improve the performance characteristics of the storage device. In other variations, memory pages may be cached without using write buffers 230, thereby enabling write buffers 230 to be omitted completely.

In step 3, controller 201 reads the second portion of the host data from write buffers 230 and applies error correction algorithms using decoder 226 to correct any errors while reading write buffers 230. Similarly, in step 4, controller 201 reads the first portion of the host data from memory array 208 and applies error correction algorithms using decoder 226 to correct any errors while reading memory array 208. The first and second portions may be combined in cache 224 for encoding by encoder 222 to prepare the host data for programming in the second phase.

In step 5, controller 201 programs the decoded and encoded data into memory array 208 in a second phase corresponding to a QLC mode. For example, by using the nested Gray code shown in mapping 330 of FIG. 3C, the memory cells that are already programmed in the MLC mode can be extended to their respective final QLC states by programming a voltage difference indicated by mapping 330. Thus, the second phase can be described as a "4-bit in-situ folding," as the existing MLC-mode programmed memory cells, which already store 2 bits of information, are adjusted in-place by programming additional voltage to the same memory cells to adjust the MLC states into their final QLC states storing 4 bits of information.

For example, the MLC UP may be mapped to the QLC TP, and the MLC LP may be mapped to the QLC MP. In this case, the second phase provides the additional programming voltage to define the remaining two bits, or the QLC UP and the QLC LP, for each memory cell. Of course, the particular pages to map from the first phase to the second phase are arbitrarily selected in mapping 330, and a different mapping may use a different selection. Note that mapping 330 maintains or increase voltages from the first to second phase, as decreasing a programmed voltage for a memory cell would require an erasure of an entire NAND block containing the memory cell.

For example, in one approach, if the data to be programmed into a particular memory cell corresponds to the bits "1000" and a read of the particular memory cell determines a read voltage within the MLC "10" distribution or MLC state AA (51), then according to mapping 130, the final state mapping to "1000" corresponds to QLC state C (S3), which has a target voltage corresponding to the middle of a voltage distribution for the QLC state C (S3). Thus, the additional voltage to program can be determined from a difference between the target voltage and the determined read voltage.

Figure 3B:
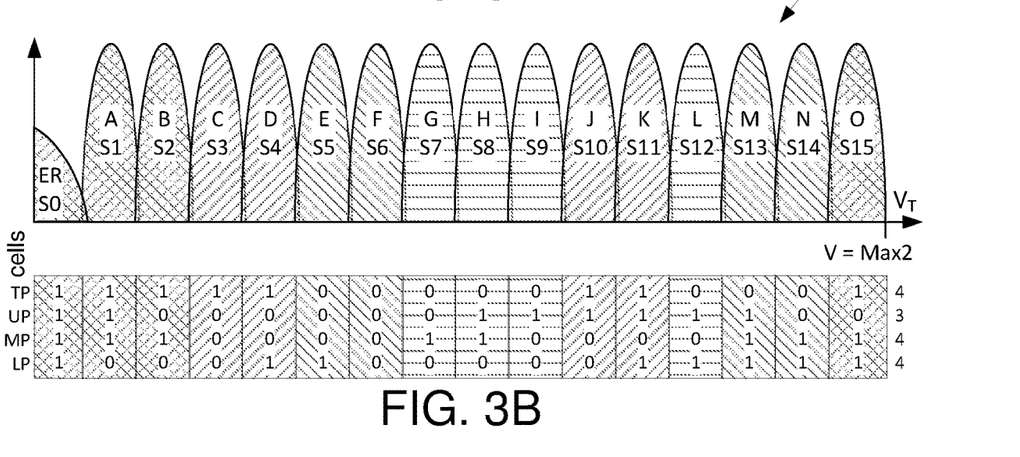
Figure 3C:
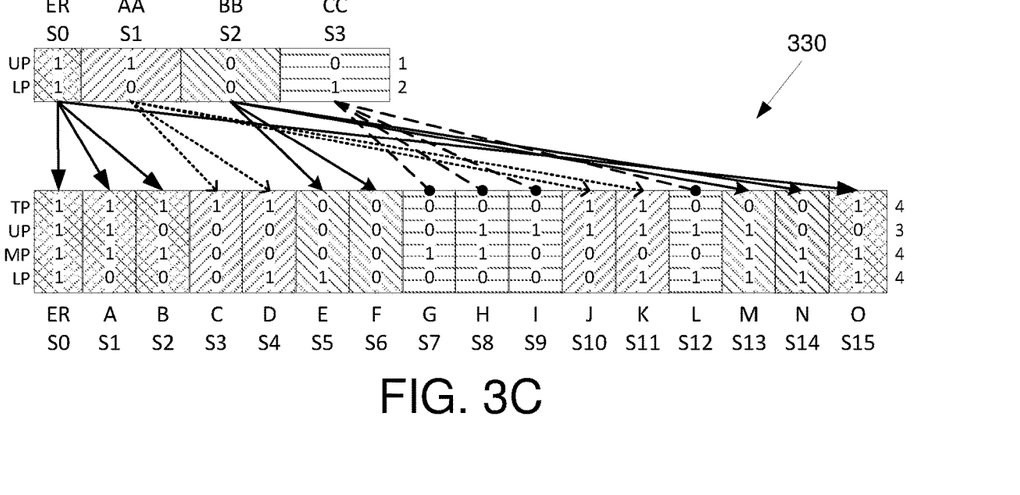
FIG. 3C illustrates an example 2-level Gray nesting for multi-phased programming.

After step 5, referring to FIG. 3B, an example program distribution 320 is shown for QLC memory cells, which may correspond memory array 208 after programming the second phase in a QLC mode. As shown in distribution 320, sixteen distributions corresponding to the erased state (ER or S0, mapped to "1111") to the fifteenth state (O or S15, mapped to "1011") are programmed into a voltage range from 0 to Max2 volts, which may be greater than Max1 and approximately 6.2 volts, for example. As shown in distribution 310 and 320, QLC states are indicated with the same shading as their respective MLC states prior to the second phase. For example, QLC ER (S0), A (S1), B (S2) and O (S15) states that are extended from the MLC ER (S0) state all share the same diagonal cross shading.

Since mapping 330 is used to generate program distribution 310 and 320 in the first and second phases, the distributions in each phase are programmed according to a balanced Gray code. As discussed above, the narrower state distributions for the first phase and the mapping of MLC states to at least two non-adjacent QLC states enable the balanced Gray code to be satisfied for each phase. Note that the term "non-adjacent QLC states" includes wraparound states, and thus mapping to QLC ER (S0) and QLC O (S15) states qualifies as "two non-adjacent QLC states."

Further, note that the sum of the transition counts for all of the pages in mapping 330 corresponds to or does not exceed the maximum number of programming levels. For example, FIG. 3C illustrates a maximum of 16 QLC states (e.g., the ER, A, B, C, D, E, F, G, H, I, J, K, L, M, N, and O states). In this example, the maximum number of programming levels for the QLC mode is 15 (e.g., 16-1=15). Here, the Gray code or the transition counts for the four pages are represented by 4-3-4-4, and the sum of the transition counts for all four pages in mapping 330 is 15 (4+3+4+4=15).

While mapping 330 is provided as one specific example of a 2-level Gray nesting, other mappings that maintain balanced Gray codes at each phase may be used as well. For example, it may be possible to determine a mapping wherein the MLC state widths are larger than 2 QLC state widths, which enables the first phase to be programmed faster. Further, mappings may be adjusted to avoid large voltage differences between phases to reduce programming time. For example, mapping 330 includes a mapping from MLC ER (S0) to QLC O (S15), which may take a long time to program due to the large voltage difference. Alternative mappings may arrange the mappings to avoid such large voltage differences between phases.

To improve programming speed, it may be beneficial to program the multiple phases in a staggered wordline programming progression, rather than sequentially by wordline. In this manner, the progression does not need to wait for each individual wordline to complete programming before proceeding, but can instead alternate program phases across different wordlines.

Figure 2B:
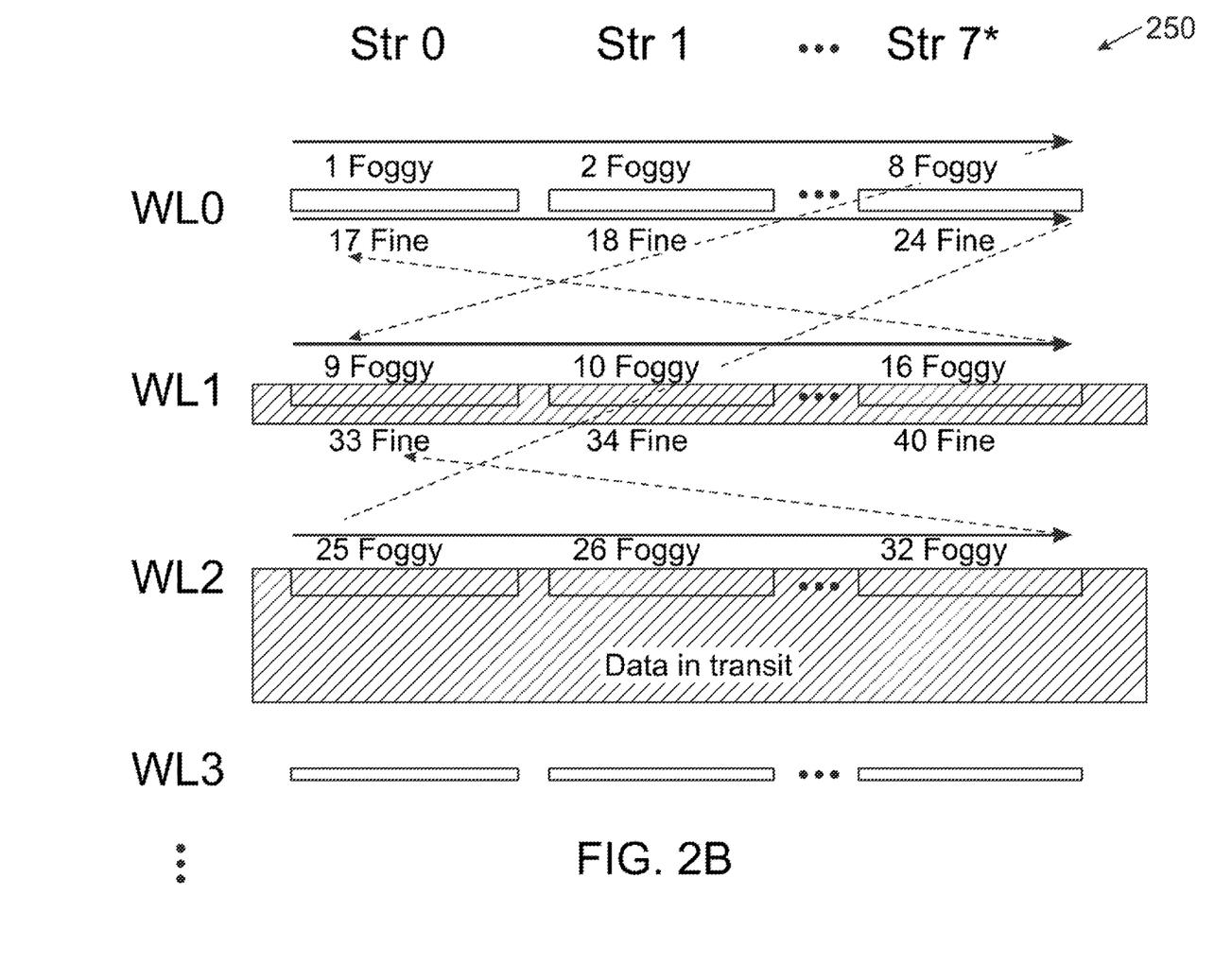
FIG. 2B illustrates an example staggered wordline programming progression for use with foggy-fine mode programming or multi-phased programming.

For example, FIG. 2B illustrates an example staggered wordline programming progression 250 for use with foggy-fine mode programming or multi-phased programming. As shown in FIG. 2B, eight strings are assumed (Str0 to Str7). Progression 250 initially programs strings 0-7 for WL0 (steps 1-8) and WL1 (steps 9-16) in a foggy phase, then jumps back to WL0 to complete programming strings 0-7 in a fine phase (steps 17-24), then jumps forward to WL2 to program strings 0-7 in a foggy phase (steps 25-32), then jumps back to WL1 to program strings 0-7 in a fine phase (steps 33-40). Progression 250 may continue programming wordline pairs in alternating foggy/fine modes for the remaining wordlines.

While FIG. 2B is specifically illustrated using foggy-fine mode programming, progression 250 can also be adapted for use by the multi-phased programming described in FIG. 2A and FIGS. 3A, 3B, and 3C. For example, FIG. 2B may be interpreted as: 1) Writing in MLC mode to WL0, 2) Writing in MLC mode to WL1, 3) Writing in QLC mode to WL0, 4) Writing in MLC mode to WL2, 5) Writing in QLC mode to WL1, and so forth.

Note that WL1 and WL2 are identified as "data in transit." In other words, the data in WL1 and WL2 may not yet be fully committed to memory array 208 and the wordlines may be "open" since the remaining phases have not yet been programmed. Thus, the data for these wordlines needs to be cached or re-read from the memory cells to complete the remaining phases. As discussed above, for the foggy-fine programming approach, only caching is possible since the memory cells are unreadable after foggy programming. However, for multi-phased programming, either approach is valid.

Thus, the data for "open" wordlines may be retained in cache 224, write buffers 230, or another location until the "open" wordlines, or WL1 and WL2, are fully programmed (i.e. all programming phases are completed). Once the data is "safe" or readable from memory array 208, then the data may be flushed from cache 224 or write buffers 230. Note that this enables cache 224 to substitute for write buffers 230, which can then be omitted. However, cache 224 should be large enough to retain the "data in transit". In this example, cache 224 should be large enough to retain up to two wordlines, which may correspond to a predetermined number of memory pages.

A first alternative progression allows the predetermined number of pages for cache 224 to be reduced. For example, if cache 224 is large enough to retain data for up to 4 memory pages, then the first alternative progression may proceed as follows: 1) Write MLC to WL0, 2) Write MLC to WL1, 3) Read WL0 (MLC) and write QLC to WL0, 4) Write MLC to WL2, 5) Read WL1, and write QLC to WL1. If reading is from memory array 208, then optional error correction may also occur, e.g. by using decoder 226. Similar to progression 250, the first alternative progression may omit write buffers 230.

A second alternative progression requires write buffers 230 to be present, but may be more suitable for storage devices with high die parallelism. Steps 1-5 described above with respect to system 200 describe the second alternative progression.

Figure 4:
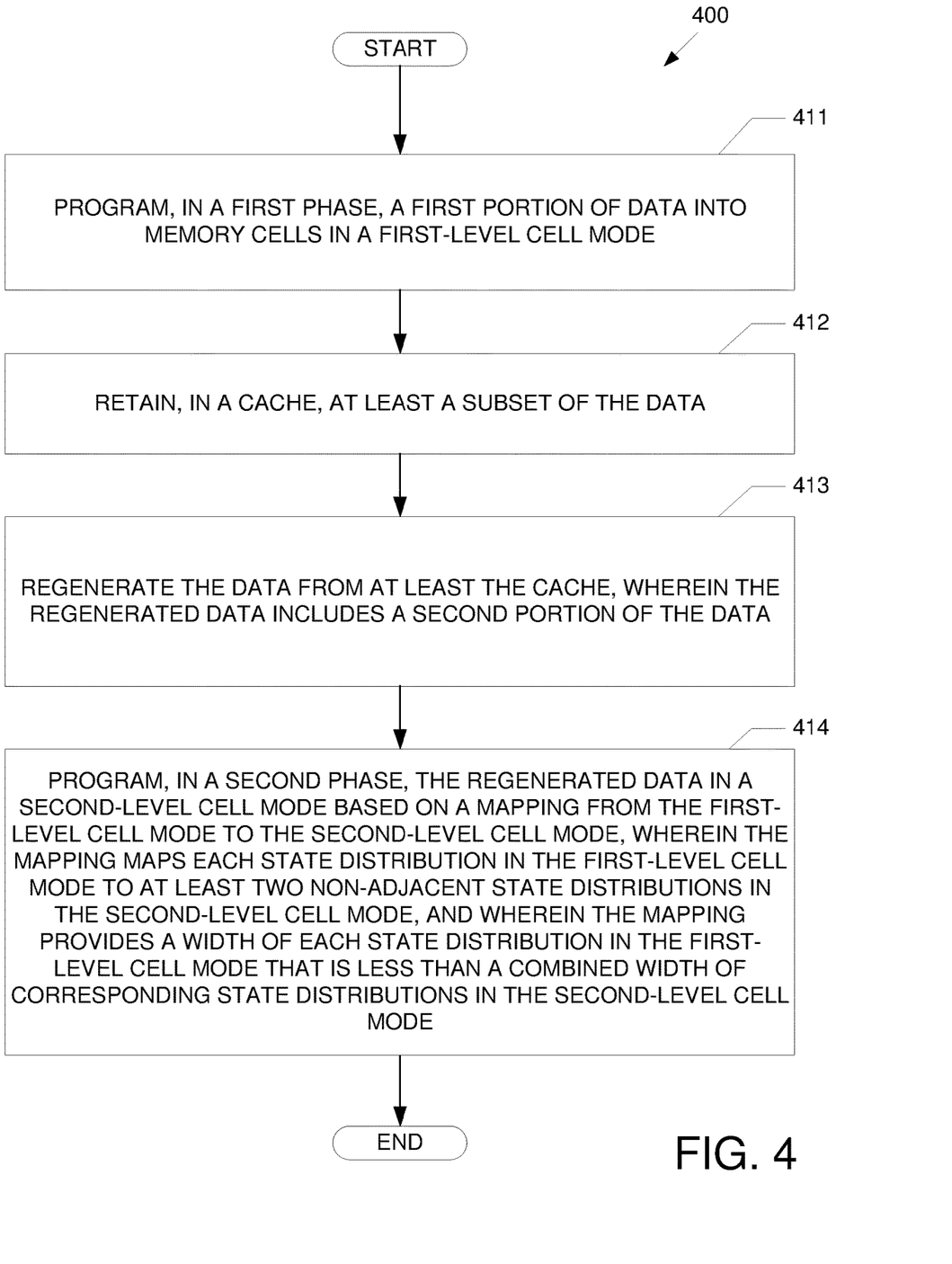
FIG. 4 is a flowchart illustrating an example process for multi-phased programming using a balanced Gray coding.

FIG. 4 is a flowchart illustrating an example process 400 for multi-phased programming using a balanced Gray coding. One or more blocks of FIG. 4 may be executed by a computing system (including, e.g., a controller of a flash memory, a data storage controller of a data storage system or a solid state storage device (SSD), a processor, or the like). Examples of a computing system or a controller may be controller 501 and/or 507. Similarly, a non-transitory machine-readable medium may include machine-executable instructions thereon that, when executed by a computer or machine, perform the blocks of FIG. 4. The steps of process 400 may be implemented as hardware/firmware or software.

Figure 5:
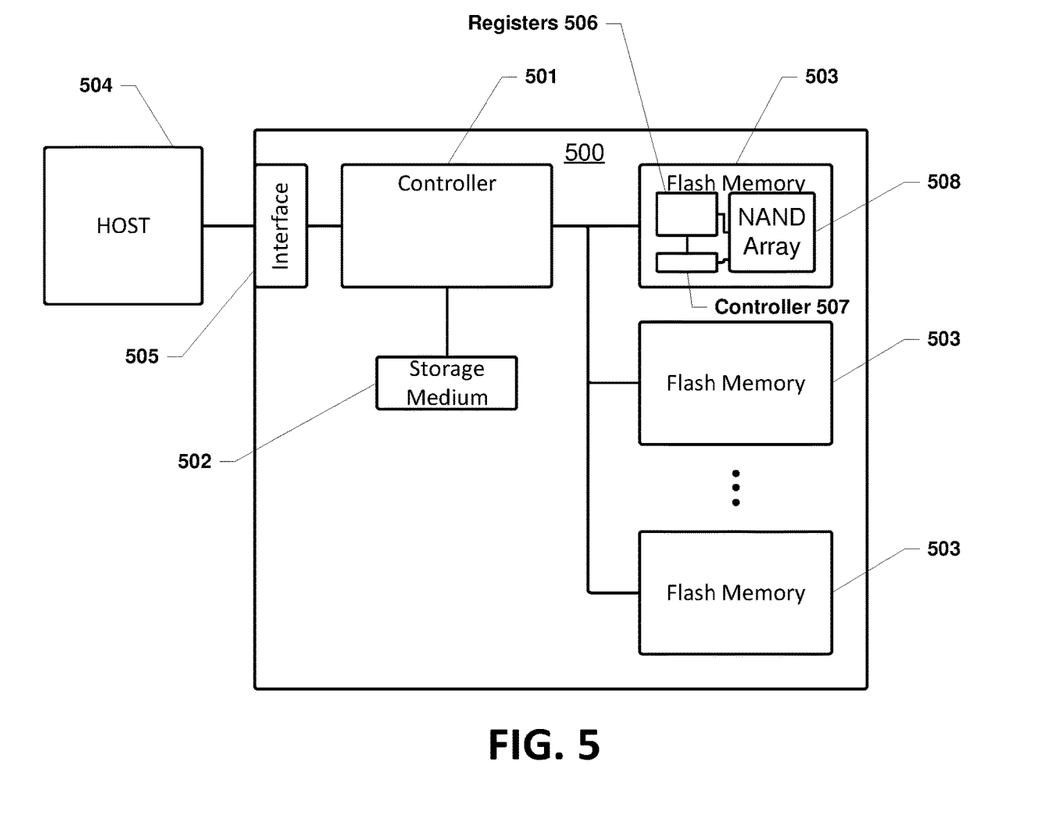
FIG. 5 is a block diagram illustrating components of an example data storage system.

In block 411, referring to FIG. 5, controller 501 programs, in a first phase, a first portion of data into NAND array 508 in a first-level cell mode. This may correspond to step 1 described above with respect to system 200, wherein controller 201 programs 2 bits of each host data nibble into memory array 208 in a MLC mode.

In block 412, referring to FIG. 5, controller 501 retains, in cache 224 or write buffers 230, at least a subset of the data. This may correspond to step 2 described above with respect to system 200, wherein controller 201 programs the remaining 2 bits of each host data nibble into write buffers 230. Alternatively, as described above with respect to progression 250 of FIG. 2A and the first alternative progression, controller 501 may store a predetermined number of memory pages in cache 224, ignoring write buffers 230. Cache 224 may correspond to storage medium 502 of FIG. 5, for example.

In block 413, referring to FIG. 5, controller 501 regenerates the data from at least storage medium 502, wherein the regenerated data includes a second portion of the data. Depending on the method used in block 412, referring to FIG. 2, block 413 reads data from cache 224 or write buffers 230. If not cached, the first portion of the data may be also read back from memory array 208 during the regeneration process. The first and second data portions may be combined to regenerate the entirety of the data, for example an entire 4-bit nibble of data. Note that in alternative aspects of the present technology, blocks 412 and 413 may be modified by reading the data directly from the programmed memory cells when write buffers 230 are omitted.

In block 414, referring to FIG. 5, controller 501 programs, in a second phase, the regenerated data in a second-level cell mode based on a mapping from the first-level cell mode to the second level cell mode. For example, controller 501 may program the regenerated data based on mapping 330 of FIG. 3C, which is a mapping from a MLC mode to a QLC mode. Further, mapping 330 maps each state distribution in the first-level cell mode (MLC mode) to at least two non-adjacent state distributions in the second-level cell mode (QLC mode). Mapping 330 also provides that a width of each state distribution in the first-level cell mode (MLC mode) is less than a combined width of corresponding state distributions in the second-level cell mode (QLC mode). As discussed above, mapping 330 satisfies these definitions, which enables mapping 330 to maintain a balanced Gray code for each phase.

FIG. 5 is a block diagram illustrating components of an example data storage system, according to aspects of the subject technology. As depicted in FIG. 5, in some aspects, data storage system 500 (e.g., a solid state drive) includes data storage controller 501, storage medium 502, and flash memory array 510 including one or more flash memory 503. Controller 501 may use storage medium 502 for temporary storage of data and information used to manage data storage system 500. Controller 501 may include several internal components (not shown) such as a read-only memory, a flash component interface (e.g., a multiplexer to manage instruction and data transport along a serial connection to flash memory 503), an I/O interface, error correction circuitry, and the like. In some aspects, all of these elements of controller 501 may be integrated into a single chip. In other aspects, these elements may be separated on their own PC board.

In some implementations, aspects of the subject disclosure may be implemented in data storage system 500. For example, aspects of the subject disclosure may be integrated with the function of data storage controller 501 or may be implemented as separate components for use in conjunction with data storage controller 501.

Controller 501 may also include a processor that may be configured to execute code or instructions to perform the operations and functionality described herein, manage request flow and address mappings, and to perform calculations and generate commands. The processor of controller 501 may be configured to monitor and/or control the operation of the components in data storage controller 501. The processor may be a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. One or more sequences of instructions may be stored as firmware on ROM within controller 501 and/or its processor. One or more sequences of instructions may be software stored and read from storage medium 502, flash memory 503, or received from host device 504 (e.g., via host interface 505). ROM, storage medium 502, flash memory 503, represent examples of machine or computer readable media on which instructions/code executable by controller 501 and/or its processor may be stored. Machine or computer readable media may generally refer to any medium or media used to provide instructions to controller 501 and/or its processor, including volatile media, such as dynamic memory used for storage media 502 or for buffers within controller 501, and non-volatile media, such as electronic media, optical media, and magnetic media.

In some aspects, controller 501 may be configured to store data received from a host device 504 in flash memory 503 in response to a write command from host device 504. Controller 501 is further configured to read data stored in flash memory 503 and to transfer the read data to host device 504 in response to a read command from host device 504.

Host device 504 represents any device configured to be coupled to data storage system 500 and to store data in data storage system 500. Host device 504 may be a computing system such as a personal computer, a server, a workstation, a laptop computer, PDA, smart phone, and the like. Alternatively, host device 504 may be an electronic device such as a digital camera, a digital audio player, a digital video recorder, and the like.

In some aspects, storage medium 502 represents volatile memory used to temporarily store data and information used to manage data storage system 500. According to aspects of the subject technology, storage medium 502 is random access memory (RAM) such as double data rate (DDR) RAM. Other types of RAM also may be used to implement storage medium 502. Memory 502 may be implemented using a single RAM module or multiple RAM modules. While storage medium 502 is depicted as being distinct from controller 501, those skilled in the art will recognize that storage medium 502 may be incorporated into controller 501 without departing from the scope of the subject technology. Alternatively, storage medium 502 may be a non-volatile memory such as a magnetic disk, flash memory, peripheral SSD, and the like.

As further depicted in FIG. 5, data storage system 500 may also include host interface 505. Host interface 505 may be configured to be operably coupled (e.g., by wired or wireless connection) to host device 504, to receive data from host device 504 and to send data to host device 504. Host interface 505 may include electrical and physical connections, or a wireless connection, for operably coupling host device 504 to controller 501 (e.g., via the I/O interface of controller 501). Host interface 505 may be configured to communicate data, addresses, and control signals between host device 504 and controller 501. Alternatively, the I/O interface of controller 501 may include and/or be combined with host interface 505. Host interface 505 may be configured to implement a standard interface, such as Serial-Attached SCSI (SAS), Fiber Channel interface, PCI Express (PCIe), SATA, USB, and the like. Host interface 505 may be configured to implement only one interface. Alternatively, host interface 505 (and/or the I/O interface of controller 501) may be configured to implement multiple interfaces, which may be individually selectable using a configuration parameter selected by a user or programmed at the time of assembly. Host interface 505 may include one or more buffers for buffering transmissions between host device 504 and controller 501.

Flash memory 503 represents a non-volatile memory device for storing data. According to aspects of the subject technology, flash memory 503 includes, for example, a NAND flash memory. Flash memory 503 may include a single flash memory device or chip, or, as depicted by FIG. 5, may include multiple flash memory devices or chips arranged in multiple channels. Flash memory 503 is not limited to any particular capacity or configuration. For example, the number of physical blocks, the number of physical pages per physical block, the number of sectors per physical page, and the size of the sectors may vary within the scope of the subject technology.

Flash memory may have a standard interface specification so that chips from multiple manufacturers can be used interchangeably (at least to a large degree). The interface hides the inner working of the flash and returns only internally detected bit values for data. In aspects, the interface of flash memory 503 is used to access one or more internal registers 506 and an internal flash controller 507 for communication by external devices. In some aspects, registers 506 may include address, command, and/or data registers, which internally retrieve and output the necessary data to and from a NAND memory cell array 508. For example, a data register may include data to be stored in memory array 508, or data after a fetch from memory array 508, and may also be used for temporary data storage and/or act like a buffer. An address register may store the memory address from which data will be fetched to host 504 or the address to which data will be sent and stored. In some aspects, a command register is included to control parity, interrupt control, and the like. In some aspects, internal flash controller 507 is accessible via a control register to control the general behavior of flash memory 503. Internal flash controller 507 and/or the control register may control the number of stop bits, word length, receiver clock source, and may also control switching the addressing mode, paging control, coprocessor control, and the like.

In some aspects, registers 506 may also include a test register. The test register may be accessed by specific addresses and/or data combinations provided at the interface of flash memory 503 (e.g., by specialized software provided by the manufacturer to perform various tests on the internal components of the flash memory). In further aspects, the test register may be used to access and/or modify other internal registers, for example the command and/or control registers. In some aspects, test modes accessible via the test register may be used to input or modify certain programming conditions of flash memory 503 (e.g., read levels) to dynamically vary how data is read from the memory cells of memory arrays 508. Registers 506 may also include one or more data latches coupled to flash memory 503.

It should be understood that in all cases data may not always be the result of a command received from host 504 and/or returned to host 504. In some aspects, Controller 501 may be configured to execute a read operation independent of host 504 (e.g., to verify read levels or BER). The predicate words "configured to", "operable to", and "programmed to" as used herein do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Controller 507 may perform the operations identified in blocks 411-414. Controller 507 may cause the operations identified in blocks 411-414 to occur, or controller 501 may provide instructions to cause or facilitate controller 507 (and registers 506) to perform operations identified in blocks 411-414.

Various examples of aspects of the disclosure are described below. These are provided as examples, and do not limit the subject technology.

One or more aspects of the subject technology provide a data storage device that may include a flash memory comprising memory cells, a cache, and a controller. The controller may be configured to program, in a first phase, a first portion of data into the memory cells in a first-level cell mode. The controller may also be configured to retain, in the cache, at least a subset of the data. The controller may also be configured to regenerate the data from at least the cache, wherein the regenerated data includes a second portion of the data. The controller may also be configured to program, in a second phase, the regenerated data in a second-level cell mode based on a mapping from the first-level cell mode to the second-level cell mode, wherein the mapping maps each state distribution in the first-level cell mode to at least two non-adjacent state distributions in the second-level cell mode, and wherein the mapping configures a width of each state distribution in the first-level cell mode to be less than a combined width of corresponding state distributions in the second-level cell mode.

In other aspects, methods are provided for multi-phased programming with balanced Gray coding. According to some aspects, a method may include programming, in a first phase, a first portion of data into memory cells of a flash memory in a first-level cell mode. The method may also include retaining, in a cache comprising single-level cells (SLC), at least a subset of the data. The method may also include regenerating the data from at least the cache, wherein the regenerated data includes a second portion of the data. The method may also include programming, in a second phase, the regenerated data in a second-level cell mode based on a mapping from the first-level cell mode to the second-level cell mode, wherein the mapping maps each state distribution in the first-level cell mode to at least two non-adjacent state distributions in the second-level cell mode, and wherein the mapping provides a width of each state distribution in the first-level cell mode that is less than a combined width of corresponding state distributions in the second-level cell mode.

In further aspects, a system may include means for programming, in a first phase, a first portion of data into memory cells of a flash memory in a multi-level cell (MLC) mode. The system may also include means for retaining, in a cache comprising single-level cells (SLC), at least a subset of the data. The system may also include means for regenerating the data from at least the cache, wherein the regenerated data includes a second portion of the data. The system may also include means for programming, in a second phase, the regenerated data in a quad-level cell (QLC) mode based on a mapping from the MLC mode to the QLC mode, wherein the mapping maps each state distribution in the MLC mode to at least two non-adjacent state distributions in the QLC mode, and wherein the mapping is configured so that a width of each state distribution in the MLC mode is less than a combined width of corresponding state distributions in the QLC mode, and wherein the mapping is configured to provide a balanced Gray code in the MLC mode and the QLC mode.

Various implementations of the methods and systems for multi-phased programming with balanced Gray coding provide several performance advantages that improve the functioning of the storage device. A host computer that interfaces with the storage device is also provided with improved functioning by operating the storage device with higher read and write performance and storage capacity. Thus, the described methods and systems provide performance benefits that improve the functioning of a storage device and a host computer.

It is understood that other configurations of the subject technology will become readily apparent to those skilled in the art from the detailed description herein, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject technology.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A data storage device, comprising:
   a flash memory comprising memory cells;
   a cache; and
   a controller configured to:
     program, in a first phase, a first portion of data into the memory cells in a first-level cell mode;
     retain, in the cache, at least a subset of the data;
     regenerate the data from at least the cache, wherein the regenerated data includes a second portion of the data; and
     program, in a second phase, the regenerated data in a second-level cell mode based on a mapping from the first-level cell mode to the second-level cell mode,
     wherein the mapping maps each state distribution in the first-level cell mode to at least two non-adjacent state distributions in the second-level cell mode,
     wherein the mapping configures a width of each state distribution in the first-level cell mode to be less than a combined width of corresponding state distributions in the second-level cell mode, and
     wherein the mapping is configured to provide a balanced Gray code in the second-level cell mode, wherein a difference between transition counts of every two adjacent pages of memory pages in the second-level cell mode does not exceed a predetermined transition count difference, and a sum of the transition counts for all of the memory pages does not exceed a maximum number of programming levels in the second-level cell mode.

2. The data storage device of claim 1, wherein the controller is configured to retain, in the cache, no more than the first portion of the data in single-level memory cells (SLC).

3. The data storage device of claim 1, wherein the controller is configured to regenerate the data by reading the first portion of the data from the programmed memory cells and combining the first portion of the data with the at least the subset of the data from the cache.

4. The data storage device of claim 1, wherein the controller is configured to retain, in the cache, the second portion of the data.

5. The data storage device of claim 4, wherein the controller is configured to retain, in the cache, the first portion of the data.

6. The data storage device of claim 1, wherein the controller is configured to program the first phase and the second phase in a staggered progression across wordlines of the memory cells.

7. The data storage device of claim 1, wherein the mapping is configured so that the width of each state distribution in the first-level cell mode is approximately half of the combined width of the corresponding state distributions in the second-level cell mode.

8. The data storage device of claim 1, wherein the controller is configured to retain, in the cache, up to a predetermined number of memory pages.

9. The data storage device of claim 1, wherein the cache is separate and distinct from the flash memory.

10. The data storage device of claim 3, wherein the cache comprises volatile random access memory, and wherein the flash memory comprises non-volatile memory.

11. A method implemented using one or more controllers for one or more storage devices, the method comprising:
    programming, in a first phase, a first portion of data into memory cells of a flash memory in a first-level cell mode;
    retaining, in a cache comprising single-level cells (SLC), at least a subset of the data;
    regenerating the data from at least the cache, wherein the regenerated data includes a second portion of the data; and
    programming, in a second phase, the regenerated data in a second-level cell mode based on a mapping from the first-level cell mode to the second-level cell mode,
    wherein the mapping maps each state distribution in the first-level cell mode to at least two non-adjacent state distributions in the second-level cell mode,
    wherein the mapping provides a width of each state distribution in the first-level cell mode that is less than a combined width of corresponding state distributions in the second-level cell mode, and
    wherein the mapping is configured to provide a balanced Gray code in the second-level cell mode, wherein a difference between transition counts of every two adjacent pages of memory pages in the second-level cell mode does not exceed a predetermined transition count difference, and a sum of the transition counts for all of the memory pages does not exceed a maximum number of programming levels in the second-level cell mode.

12. The method of claim 11, wherein regenerating the data comprises reading the first portion of the data from the programmed memory cells and combining the first portion of the data with the at least the subset of the data from the cache.

13. The method of claim 11, wherein the at least the subset of the data includes the second portion of the data.

14. The method of claim 13, wherein the at least the subset of the data includes the first portion of the data.

15. The method of claim 11, wherein programming in the first phase and programming in the second phase executes in a staggered progression across wordlines of the memory cells.

16. The method of claim 11, wherein the mapping is configured so that the width of each state distribution in the first-level cell mode is approximately half of the combined width of the corresponding state distributions in the second-level cell mode.

17. A system, comprising:
    means for programming, in a first phase, a first portion of data into memory cells of a flash memory in a multi-level cell (MLC) mode;
    means for retaining, in a cache comprising single-level cells (SLC), at least a subset of the data;
    means for regenerating the data from at least the cache, wherein the regenerated data includes a second portion of the data; and
    means for programming, in a second phase, the regenerated data in a quad-level cell (QLC) mode based on a mapping from the MLC mode to the QLC mode,
    wherein the mapping maps each state distribution in the MLC mode to at least two non-adjacent state distributions in the QLC mode, and
    wherein the mapping is configured so that a width of each state distribution in the MLC mode is less than a combined width of corresponding state distributions in the QLC mode, and wherein the mapping is configured to provide a balanced Gray code in the MLC mode and the QLC mode.

18. The system of claim 17, wherein the mapping is configured so that the width of each state distribution in the MLC mode is approximately 50% to 75% of the combined width of the corresponding state distributions in the QLC mode.

* * * * *